United States Patent
Tanaka et al.

(10) Patent No.: US 8,963,152 B2
(45) Date of Patent: Feb. 24, 2015

(54) TFT, SHIFT REGISTER, SCANNING SIGNAL LINE DRIVE CIRCUIT, SWITCH CIRCUIT, AND DISPLAY DEVICE

(75) Inventors: Shinya Tanaka, Osaka (JP); Tetsuo Kikuchi, Osaka (JP); Hajime Imai, Osaka (JP); Hideki Kitagawa, Osaka (JP); Yoshiharu Kataoka, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1225 days.

(21) Appl. No.: 12/867,510

(22) PCT Filed: Oct. 9, 2008

(86) PCT No.: PCT/JP2008/068362
§ 371 (c)(1),
(2), (4) Date: Sep. 23, 2010

(87) PCT Pub. No.: WO2009/104302
PCT Pub. Date: Aug. 27, 2009

(65) Prior Publication Data
US 2011/0001736 A1    Jan. 6, 2011

(30) Foreign Application Priority Data

Feb. 19, 2008  (JP) ................................. 2008-037624
May 13, 2008   (JP) ................................. 2008-126372

(51) Int. Cl.
*H01L 29/41*      (2006.01)
*H01L 27/12*      (2006.01)
*G09G 3/36*       (2006.01)

(52) U.S. Cl.
CPC ...... *H01L 27/1214* (2013.01); *G02F 2201/124* (2013.01); *G09G 3/3648* (2013.01); *G09G 2310/0297* (2013.01)

USPC ........ 257/59; 257/72; 257/E29.291; 345/204; 345/206; 345/208; 438/28

(58) Field of Classification Search
USPC .......... 257/57, 66, E29.291; 438/28; 345/204
See application file for complete search history.

(56) References Cited

U.S. PATENT DOCUMENTS

| | | | |
|---|---|---|---|
| 2004/0173795 A1* | 9/2004 | Moon et al. ...................... | 257/59 |
| 2005/0056847 A1* | 3/2005 | Nakamura et al. .............. | 257/72 |
| 2005/0145849 A1 | 7/2005 | Moon et al. | |
| 2006/0033105 A1 | 2/2006 | Fujii et al. | |
| 2006/0146218 A1* | 7/2006 | Her et al. ........................ | 349/43 |
| 2006/0228974 A1* | 10/2006 | Thelss et al. .................... | 445/24 |
| 2008/0024690 A1 | 1/2008 | Hirakata et al. | |
| 2008/0129910 A1 | 6/2008 | Fujii et al. | |
| 2009/0109162 A1 | 4/2009 | Moon et al. | |
| 2009/0166638 A1* | 7/2009 | Honda ............................ | 257/71 |

FOREIGN PATENT DOCUMENTS

| | | |
|---|---|---|
| JP | 2-275672 | 11/1990 |
| JP | 2-277027 | 11/1990 |
| JP | 3-50731  | 3/1991  |

(Continued)

*Primary Examiner* — Cheung Lee
*Assistant Examiner* — Stephen Bradley
(74) *Attorney, Agent, or Firm* — Birch, Stewart, Kolasch & Birch, LLP

(57) ABSTRACT

A distance (d1) from an edge of a first region (R) at places (D) where branch electrodes (4b) extending, which branch off from an electrode line (4a) of a second source/drain electrode (4), start to overlap with a first region (R) to the electrode line (4a) is 5 μm or more. This realizes a TFT including a comb-shaped source/drain structure that enables easy repair of a source-drain leakage.

23 Claims, 14 Drawing Sheets

(56) References Cited

FOREIGN PATENT DOCUMENTS

| JP | 3-245126 | 10/1991 |
| JP | 5-283695 | 10/1993 |
| JP | 2001-330853 | 11/2001 |
| JP | 2004-274050 | 9/2004 |
| JP | 2005-84416 | 3/2005 |
| JP | 2005-535147 | 11/2005 |
| WO | WO 2006/126460 A1 | 11/2006 |

* cited by examiner

F I G. 7
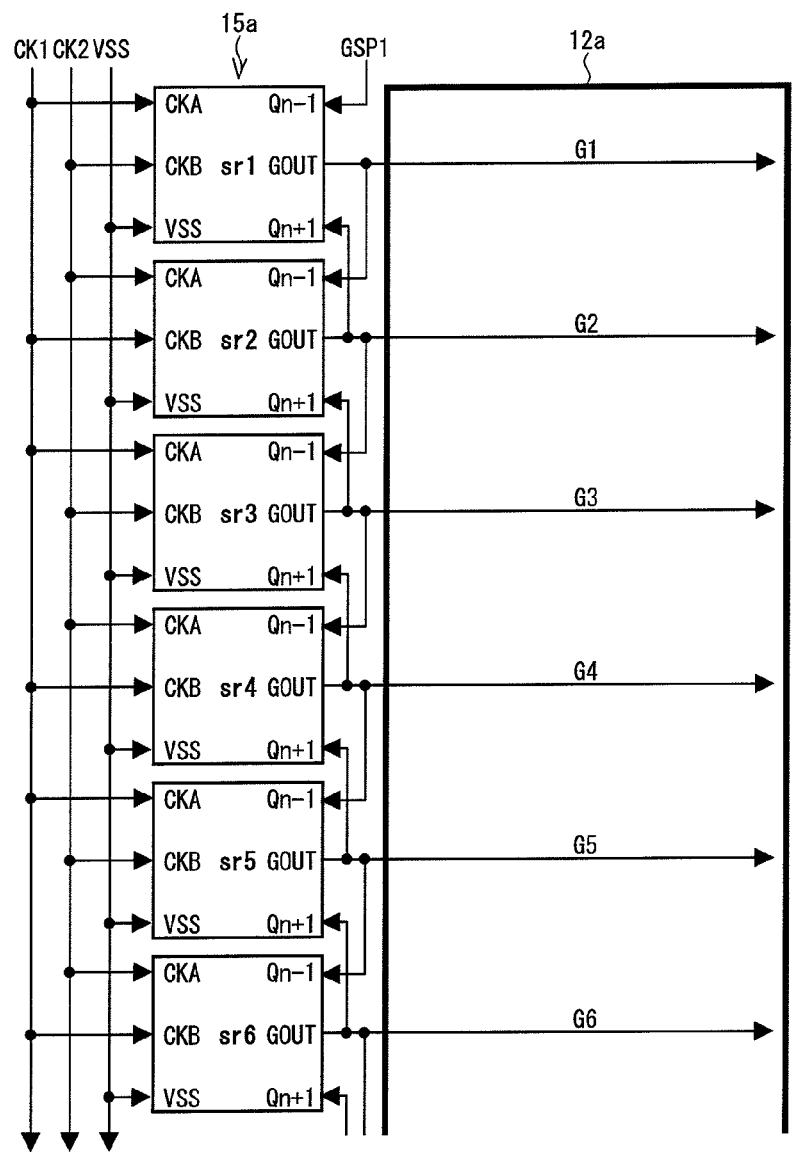

F I G. 1 4
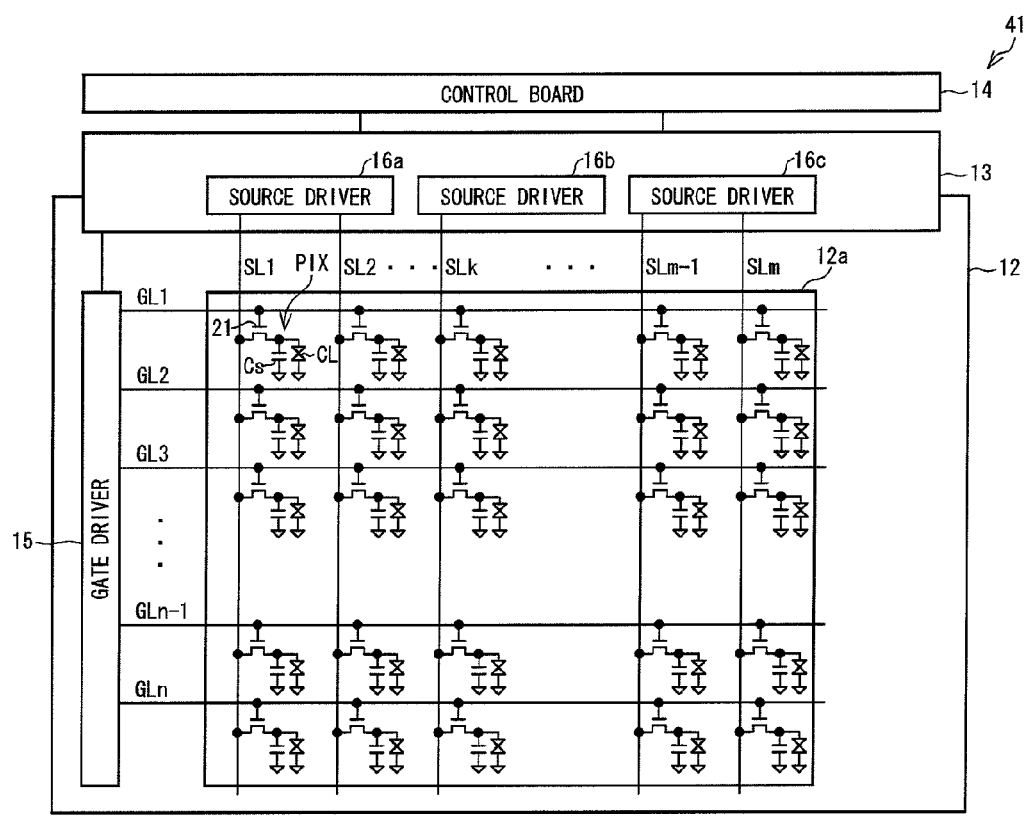

TFT, SHIFT REGISTER, SCANNING SIGNAL LINE DRIVE CIRCUIT, SWITCH CIRCUIT, AND DISPLAY DEVICE

TECHNICAL FIELD

The present invention relates to a structure of a transistor monolithically fabricated with a display panel.

BACKGROUND ART

In recent years, monolithic integration of a gate driver has been developed for the purpose of cost reduction. In the monolithic integration, the gate driver is formed with use of amorphous silicon on a liquid crystal panel. The term "monolithic gate driver" is also associated with the terms such as "gate driver-free", "built-in gate driver in panel", and "gate in panel".

A TFT using amorphous silicon requires high driving voltage due to its low mobility. Moreover, in order to charge interconnect capacitance of scanning signal lines with scanning pulses, there is no other alternative but to manufacture the TFT so as to have a considerably large channel width in the order of millimeters or centimeters.

FIG. 8 is a plane view illustrating a structure of such a TFT disclosed in Patent Literature 1. The TFT is manufactured with use of amorphous silicon and includes a gate electrode line 310, a drain electrode line 330, and a source electrode line 350.

The drain electrode line 330 is composed of a body drain electrode line 332 extending from the outside of the gate electrode line 310, hand drain electrode lines 334 that branch off from the body drain electrode line 332, and finger drain electrode lines 336 that perpendicularly branch off from the hand drain electrode lines 334. The hand drain electrode lines 334 are formed in a region where the gate electrode line 310 is not formed, while the finger drain electrode lines 336 are formed in a region where the gate electrode line 310 is formed.

The source electrode line 350 is composed of a body source electrode line 352 extended from the outside of the gate electrode line 310, hand source electrode lines 354 that branch off from the body source electrode line 352, and finger source electrode lines 356 that perpendicularly branch off from the hand source electrode lines 354. The hand source electrode lines 354 are formed in a region where the gate electrode line 310 is not formed, and the finger source electrode lines 356 are formed in a region where the gate electrode line 310 is formed.

In the above-described TFT, the I-shaped finger drain electrode lines 336 are respectively surrounded by the U-shaped finger source electrode lines 356, so that a channel is formed therebetween.

FIG. 9 illustrates a structure also disclosed in Patent Literature 1. This structure can be used as a partial TFT region 200 in which one finger drain electrode line 336 is surrounded by the U-shaped finger source electrode lines 356. Note that, in FIG. 9, the partial TFT region 200 is composed of a gate electrode line indicated by a reference numeral 210, a source electrode line indicated by a reference numeral 230, and a drain electrode line indicated by a reference numeral 240. In the structure in FIG. 8, the gate electrode line 210 extends continuously to other partial TFT regions 200 along the extending direction of the hand drain electrode lines 334 and the hand source electrode lines 354. In FIG. 9, a channel width W is expressed by 2×DL1+DL2. This is an average distance of (i) a length of a borderline between the source electrode line 230 and the channel region and (ii) a length of a borderline between the drain electrode line 240 and the channel region. A channel length L is a distance between (i') the borderline between the source electrode line 230 and the channel region and (ii') the borderline between the drain electrode line 240 and the channel region. In Patent Literature 1, a large number of such partial TFT regions 200 are connected in parallel. This keeps parasitic capacitance between the gate electrode and the drain electrode low, while realizing a very large channel width W.

CITATION LIST

Patent Literature 1
Japanese Patent Application Publication Tokukai No. 2004-274050 A (Publication Date: Sep. 30, 2004)
Patent Literature 2
Japanese Patent Application Publication Tokukai No. 2001-330853 A (Publication Date: Nov. 30, 2001)
Patent Literature 3
Japanese Patent Application Publication Tokukaihei No. 3-50731 A (1991) (Publication Date: Mar. 5, 1991)
Patent Literature 4
Japanese Patent Application Publication Tokukaihei No. 2-277027 A (1990) (Publication Date: Nov. 13, 1990)

SUMMARY OF INVENTION

However, a conventional TFT with a comb-shaped source/drain structure has a problem that even one leakage anywhere between the source electrode and the drain electrode causes abnormalities in the characteristics of the entire TFT.

As shown in (a) of FIG. 10, for example, there is a case where a process defect or the like causes one of the finger source electrode lines 102a of the source electrode line 102 and one of the finger drain electrode lines 103a of the drain electrode line 103 to be shorted to each other in a region above the gate electrode line 101. This means that shorting occurs in the entire source electrode line 102 and the entire drain electrode line 103. Consequently, the entire TFT ends up not operating properly. In such a case, the short-circuited finger drain electrode line 103a should be isolated from the main body of the drain electrode line 103 by laser-fusing it at a point P, which makes normal use of the whole TFT possible.

However, in a conventional TFT, a distance from the main body of the electrode line 103 to the region above the gate electrode line 101 is short. As such, in an attempt to laser-fuse the finger drain electrode line 103, the laser spot area also overlap with the layer provided in the region above the gate electrode line 101.

(b) of FIG. 10 is a cross-sectional view taken along the line C-C' in (a) of FIG. 10. The cross section passes through the center of the finger drain electrode line 103a in the extending direction thereof.

In this cross section structure, a gate electrode line 101, a gate dielectric layer 105, an i layer (semiconductor layer) 106, an n⁺ layer 107, a source electrode line 102, a drain electrode line 103, a finger drain electrode line 103a, and a passivation layer 108 are stacked on a glass substrate 100. Assuming that the gate electrode line 101 has a width x-x', a stack of the i layer 106 and the n⁺ layer 107 has a footprint with a width y-y' extending through and beyond the region of x-x'. When a connecting location between the finger drain electrode line 103a and the main body of the drain electrode line 103 is indicated by z, focusing the laser spot merely approximately on the range x'-z results in a direct projection of the laser spot onto the stack of the i layer 106 and the n⁺ layer 107. Because the stack adjoins other partial TFT regions, if the stack is damaged by the laser irradiation, the damage heat is transferred to the adjoining regions. This causes a wide range of TFT regions including the adjoining partial TFT region to be damaged.

However, because the range y'-z is narrow, and there is a big step in the order of micrometers in the layer structure in the range x'-z, even if an attempt is made to partialize the laser spot in the range y'-z, it is difficult even for an optical system having a focal depth to optically focus on the positions of the both ends of the range x'-z simultaneously and accurately so that the laser spot is directed at a target object at high resolution.

As described above, the conventional TFT with a large channel width had difficulty in repairing a source-drain leakage. However, failure in repairing such leakage causes the whole display panel to be defective, thereby severely damaging the manufacture of the TFT.

The present invention has been attained in view of the above conventional problems, and an object thereof is to realize: a TFT including a comb-shaped source/drain structure which enables easy repair of a source-drain leakage; a shift register; a scanning signal line; a switch circuit; and a display device each including the TFT.

In order to achieve the above object, a TFT according to the present invention includes a gate electrode, a first source/drain electrode, and a second source/drain electrode, one of the first source/drain electrode and the second source/drain electrode being a source electrode and the other being a drain electrode, the TFT including an i layer and a stack in which an $n^+$ layer is stacked on the i layer, the i layer and the stack being formed from a semiconductor material and disposed above the gate electrode but with a dielectric layer under the i layer and the stack in a layer-thickness direction, the first source/drain electrode being disposed on the $n^+$ layer in a first region, the first region being a panel in-plane region where the i layer is provided, the second source/drain electrode including an electrode line provided outside the first region and a plurality of branch electrodes branching off and extending from the electrode line, the branch electrodes extending from the electrode line onto the $n^+$ layer in the first region, the i layer having a pattern provided between the first source/drain electrode and the branch electrodes in the first region in a panel in-plane direction, the pattern including no $n^+$ layer in the first region, and in the TFT according to the present invention, when the gate electrode is seen in the layer-thickness direction, an edge of the first region at first places where the branch electrodes extending start to overlap with the first region is (i) nearer to the electrode line than an edge of the gate electrode at second places where the branch electrodes extending start to overlap with a region of the gate electrode; or (ii) in a same position as the edge of the gate electrode at the second places; and a first distance from the edge of the first region at the first places to the electrode line is 5 μm or more.

With the above invention, the first distance from the edge of the first region to the electrode line at the place where the branch electrodes extending start to overlap with the first region is set to be 5 μm or more. Therefore, in a case where a leakage occurs between the first source/drain electrode and a branch electrode of the second source/drain electrode, the laser spot can easily be projected onto the branch electrode so as to be away from the edge of the first region and also from the electrode line. Because the aforementioned distance is long, the magnification of the optical system for directing the laser spot at a target object is not necessarily very high. As such, the laser spot can be roughly aligned on the branch electrode. This enables, even when the branch electrode is laser-fused, to avoid a direct projection of the laser onto the stack of the i layer and the $n^+$ layer. Therefore, the other adjoining partial TFT regions are in no danger of being damaged by the heat transmission.

As a consequence, an effect is produced that a TFT is realized including a comb-shaped source/drain structure that enables easy repair of a source-drain leakage.

In order to achieve the above object, in the TFT according to the present invention, the first distance is 10 μm or less.

The above invention produces an effect that the size of the TFT is allowed to be small as a whole. As such, the size of the TFT can easily be made smaller than a normal size of a TFT formed in a general-purpose display device, for example.

In order to achieve the above object, in the TFT according to the present invention, the branch electrode is provided with a cutout narrowing a line width thereof, the cutout being provided on one side or both sides of the branch electrode in a width direction thereof at a part immediately in front of the first place.

The above invention makes it easy to find out where the branch electrodes extending start to overlap with the first region by observing the pattern of the cutout(s) provided in the branch electrode. This produces an effect that alignment of the laser spot when laser-fusing the branch electrode becomes easier.

In order to achieve the above object, a TFT according to the present invention includes a gate electrode, a first source/drain electrode, and a second source/drain electrode, one of the first source/drain electrode and the second source/drain electrode being a source electrode and the other being a drain electrode, the TFT including an i layer and a stack in which an $n^+$ layer is stacked on the i layer, the i layer and the stack being formed from a semiconductor material and disposed above the gate electrode but with a dielectric layer under the i layer and the stack in a layer thickness direction, the first source/drain electrode being disposed on the $n^+$ layer in a first region, the first region being a panel in-plane region where the i layer is provided, the second source/drain electrode including an electrode line provided outside the first region and a plurality of branch electrodes branching off and extending from the electrode line, the branch electrodes extending from the electrode line onto the $n^+$ layer in the first region, the i layer having a pattern provided between the first source/drain electrode and the branch electrodes in the first region in a panel in-plane direction, the pattern including no $n^+$ layer in the first region, and in the TFT according to the present invention, when the gate electrode is seen in the layer-thickness direction, an edge of the first region at first places where the branch electrodes extending start to overlap with the first region is more away from the electrode line than an edge of the gate electrode at second places where the branch electrodes extending start to overlap with a region of the gate electrode; and a second distance from the edge of the gate electrode at the second places to the electrode line is 5 μm or more.

With the above invention, the second distance from the edge of the gate electrode to the electrode line at the place where the branch electrodes extending start to overlap with the region of the gate electrode is set to be 5 μm or more. Therefore, in a case where a leakage occurs between the first source/drain electrode and a branch electrode of the second source/drain electrode, the laser spot can easily be projected onto the branch electrode so as to be away from the edge of the first region and also from the electrode line. Because the aforementioned distance is long, the magnification of the optical system for directing the laser spot at a target object is not necessarily very high. As such, the laser spot can be roughly aligned on the branch electrode. This enables, even when the branch electrode is laser-fused, to avoid a direct projection of the laser onto the stack of the i layer and the n+ layer. Therefore, the other adjoining partial TFT regions are in no danger of being damaged by the heat transmission.

As a consequence, an effect is produced that a TFT is realized including a comb-shaped source/drain structure that enables easy repair of a source-drain leakage.

In order to achieve the above object, in the TFT according to the present invention, the second distance is 10 μm or less.

The above invention produces an effect that the size of the TFT is allowed to be small as a whole. As such, the size of the TFT can easily be made smaller than a normal size of a TFT formed in a multi-purpose display device, for example.

In order to achieve the above object, in the TFT according to the present invention, the branch electrode is provided with a cutout narrowing a line width thereof, the cutout being provided on one side or both sides of the branch electrode in a width direction thereof at a part immediately in front of the second place.

The above invention makes it easy to find out where the branch electrodes extending start to overlap with the region of the gate electrode by observing the pattern of the cutout(s) provided in the branch electrode. This produces an effect that alignment of the laser spot when laser-fusing the branch electrodes becomes easier.

In order to achieve the above object, in the TFT according to the present invention, the electrode line is provided with a cutout narrowing a line width thereof, the cutout being provided on one side or both sides of branching points where the branch electrodes branch off from the electrode line.

The above invention makes it easy to find out positions of branching points where the branch electrodes branch off from the electrode line by observing the pattern of the cutout(s) provided in the electrode line. This produces an effect that alignment of the laser spot when laser-fusing the branch electrode becomes easier.

In order to achieve the above object, in the TFT according to the present invention, the semiconductor material is amorphous silicon.

It is advantageous for a TFT using amorphous silicon to adopt a comb-shaped source/drain structure having a large channel width so as to enhance the driving ability thereof. With the above invention, manufacturing the TFT using amorphous silicon allows manufacturing yield of the TFT to be improved, thereby significantly reducing costs.

In order to achieve the above object, in the TFT according to the present invention, the semiconductor material is microcrystal silicon.

A TFT using microcrystal silicon has higher mobility than an amorphous silicon TFT. As such, the above invention produces an effect of making the transistor size small in comparison with the amorphous silicon TFT. Moreover, using microcrystal silicon in a TFT realizes a small-footprint TFT, which is advantageous for a slim picture frame. It is also possible to curb variations in threshold voltage caused by application of DC biases.

In order to achieve the above object, the shift register according to the present invention includes a plurality of stages composed of transistors, and in the shift register according to the present invention, at least one of the transistors is the foregoing TFT.

The above invention produces an effect that the shift register can be manufactured with high yield.

In order to achieve the above object, a scanning line drive circuit according to the present invention includes the foregoing shift register, and the shift register is used to generate a scanning signal for a display device.

The above invention produces an effect that the scanning signal line drive circuit can be manufactured with high yield.

In order to achieve the above object, in the scanning signal line drive circuit according to the present invention, the TFT is an output transistor outputting the scanning signal.

With the above invention, the TFT is used as an output transistor for outputting a scanning signal. This produces an effect that a TFT for which high driving ability is required can be manufactured with high yield.

In order to achieve the above object, the display device according to the present invention includes the foregoing scanning signal line drive circuit.

The above invention produces an effect that the display device can be manufactured with high yield.

In order to achieve the above object, in the display device according to the present invention, the scanning signal line drive circuit is formed on a display panel so as to be monolithically integrated with a display region.

The above invention produces an effect that it can make up for the disadvantage that the TFT cannot help but having a large channel width. Consequently, it is possible to manufacture, with high yield, a display device in which the scanning signal line drive circuit is formed on the display panel so as to be monolithically integrated with the display region.

In order to achieve the above object, a switch circuit according to the present invention includes a plurality of the foregoing TFTs, and the TFTs are provided correspondingly for a plurality of paths, respectively, and the TFTs serving as switches via which each of outputs of a data signal line drive circuit is connected to the respective paths in a branched manner.

With the above invention, each of the outputs of the data signal line drive circuits are branched and connected to a plurality of paths via the switches composed of the TFTs. This produces an effect that a switch circuit composed of the TFTs having large channel widths can be manufactured with high yield. The TFTs with large channel widths are advantageously used to connect the outputs to low-impedance loads at the branch destinations.

In order to achieve the above object, in the switch circuit according to the present invention, when seen in a layer-thickness direction, each of the TFTs serving as the switch has a rectangular region whose longer side is in parallel with an extending direction of data signal lines serving as the paths.

The above invention produces an effect that each of the switches can be arranged, with respect to each data signal line, in such a manner that the longer side of the switch extends along the extending direction of the data signal line.

In order to achieve the above object, in the switch circuit according to the present invention, when seen in a layer-thickness direction, each of the TFTs serving as the switches has a rectangular region whose longer side is orthogonal to an extending direction of data signal lines serving as the plurality of paths.

The above invention produces an effect that the switches can be aligned, with respect to each output of the data signal line drive circuit, along the extending direction of the data signal line, i.e., a direction orthogonal to the longer side of the switches.

In order to achieve the above object, a display device according to the present invention includes the foregoing switch circuit and the foregoing data signal line drive circuit, and the plurality of paths are data signal lines.

The above invention produces an effect that it is possible to manufacture, with high yield, a display device in which the outputs of the data signal line drive circuit are each branched and connected to a plurality of data signal lines.

In order to achieve the above object, in the display device according to the present invention, the display device is driven such that, with respect to each of the outputs, the switches are conducted in a time-sharing manner during a horizontal period.

The above invention produces an effect that it is possible to manufacture, with high yield, a display device driven by a so-called SSD method that is driven to conduct a plurality of switches respectively connected to the outputs of the data signal line drive circuit in a time-sharing manner.

In order to achieve the above object, in the display device according to the present invention, the switch circuit is formed on a display panel so as to be monolithically integrated with a display region.

The above invention can make up for the disadvantage that the TFT cannot help but having a large channel width. Consequently, it is possible to manufacture, with high yield, a display device in which the switch circuit is formed on the display panel so as to be monolithically integrated with the display region.

In order to achieve the above object, a display device according to the present invention includes the foregoing scanning signal line drive circuit, the foregoing switch circuit, and the foregoing data signal line drive circuit, and the plurality of paths being data signal lines.

The above invention produces an affect that the scanning signal line drive circuit and the switch circuit can be manufactured with high yields.

In order to achieve the above object, in the display device according to the present invention, at least one of the scanning signal line drive circuit and the switch circuit is formed on a display panel so as to be monolithically integrated with a display region.

The above invention can make up for the disadvantage that the TFT cannot help but having a large channel width. Consequently, it is possible to manufacture, with high yield, a display device in which the scanning signal line drive circuit and the switch circuit are formed on the display panel so as to be monolithically integrated with the display region.

In order to achieve the above object, in the display device according to the present invention, the foregoing TFT is formed on a display panel so as to be monolithically integrated with the display region.

The above invention can make up for the disadvantage that the TFT cannot help but having a large channel width. Consequently, it is possible to manufacture, with high yield, a display device in which the scanning signal line drive circuit is formed on the display panel so as to be monolithically integrated with the display region.

The other objects, features, and advantages of the present invention will be fully understood from the following description. The benefits of the present invention will become apparent from the following explanation with reference to the accompanying drawings.

BRIEF DESCRIPTION OF DRAWINGS

FIG. 7 is a circuit block diagram illustrating a structure of a shift register in a scanning signal line drive circuit included in the display device in FIG. 6.

FIG. 14 is a block diagram illustrating a common structure of a display device driven by the SSD method.

REFERENCE SIGNS LIST

1 TFT
2 Gate Electrode
3 First Source/Drain Electrode
4 Second Source/Drain Electrode
4a Electrode Line
4b Branch Electrode
11 Liquid Crystal Display Device (Display Device)
15 Gate Driver (Scanning Signal Line Drive Circuit)
15a Shift Register
22 Gate Dielectric Layer (Dielectric Layer)
23 Stack
23a i Layer
23b n$^+$ Layer
31 Cutout (Cutout provided in the branch electrode)
32 Cutout (Cutout provided in the electrode line)
51 Liquid Crystal Display Device (Display Device)
52 Source Driver (Data Signal Line Drive Circuit)
54 Gate Driver (Scanning Signal Line Drive Circuit)
55 Switch Circuit
61 Liquid Crystal Display Device (Display Device)
D Place (First Place)
d1 Distance (First Distance)
d2 Distance (Second Distance)
R First Region
ASWR, ASWG, ASWB Switches
DATA Output

DESCRIPTION OF EMBODIMENTS

[Embodiment 1]

The following will describe an embodiment of the present invention with reference to FIGS. 1 to 7.

Figure 6:
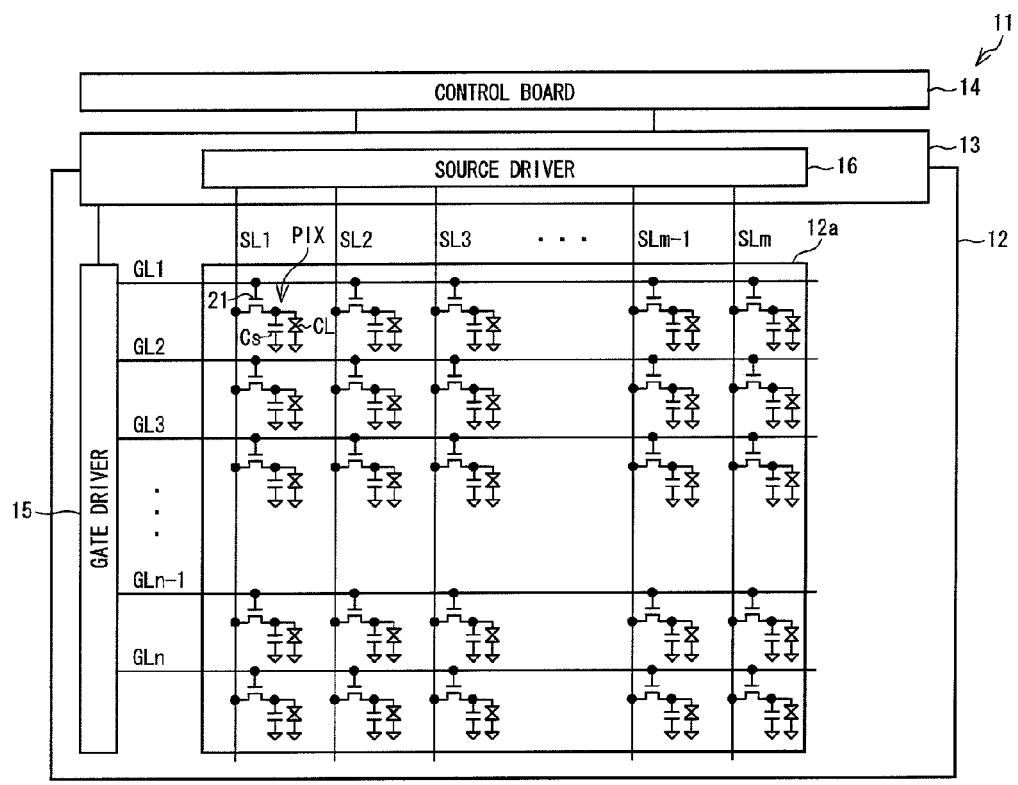
FIG. 6 is a block diagram illustrating a structure of a display device according to an embodiment of the present invention.
Figure 8:
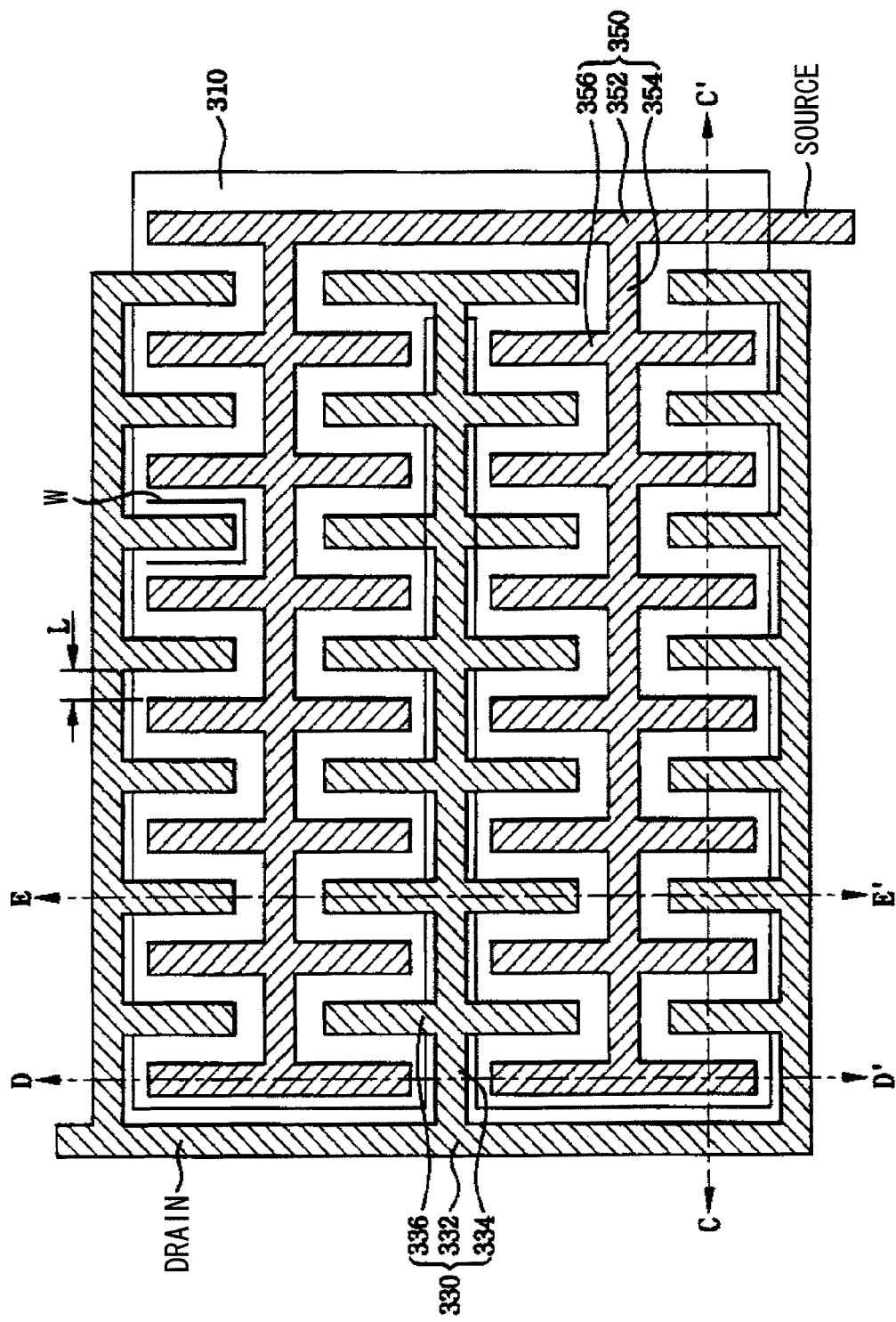
FIG. 8 is a plane view illustrating an overall structure of a TFT according to a conventional art.
Figure 9:
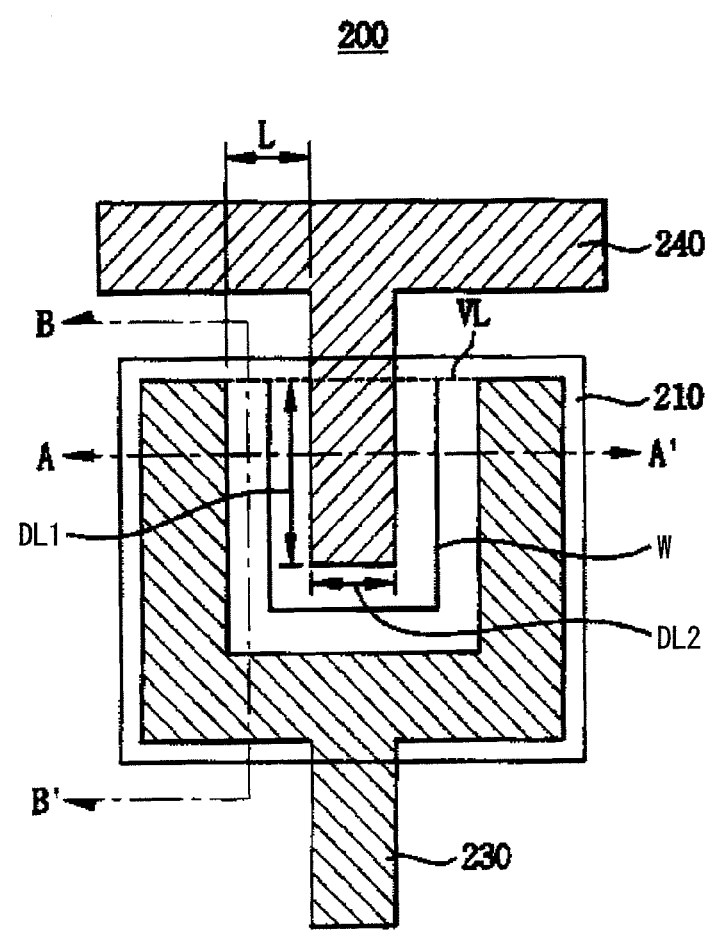
FIG. 9 is a plane view illustrating a structure of a partial TFT region that is applicable to the TFT in FIG. 8.
Figure 10:
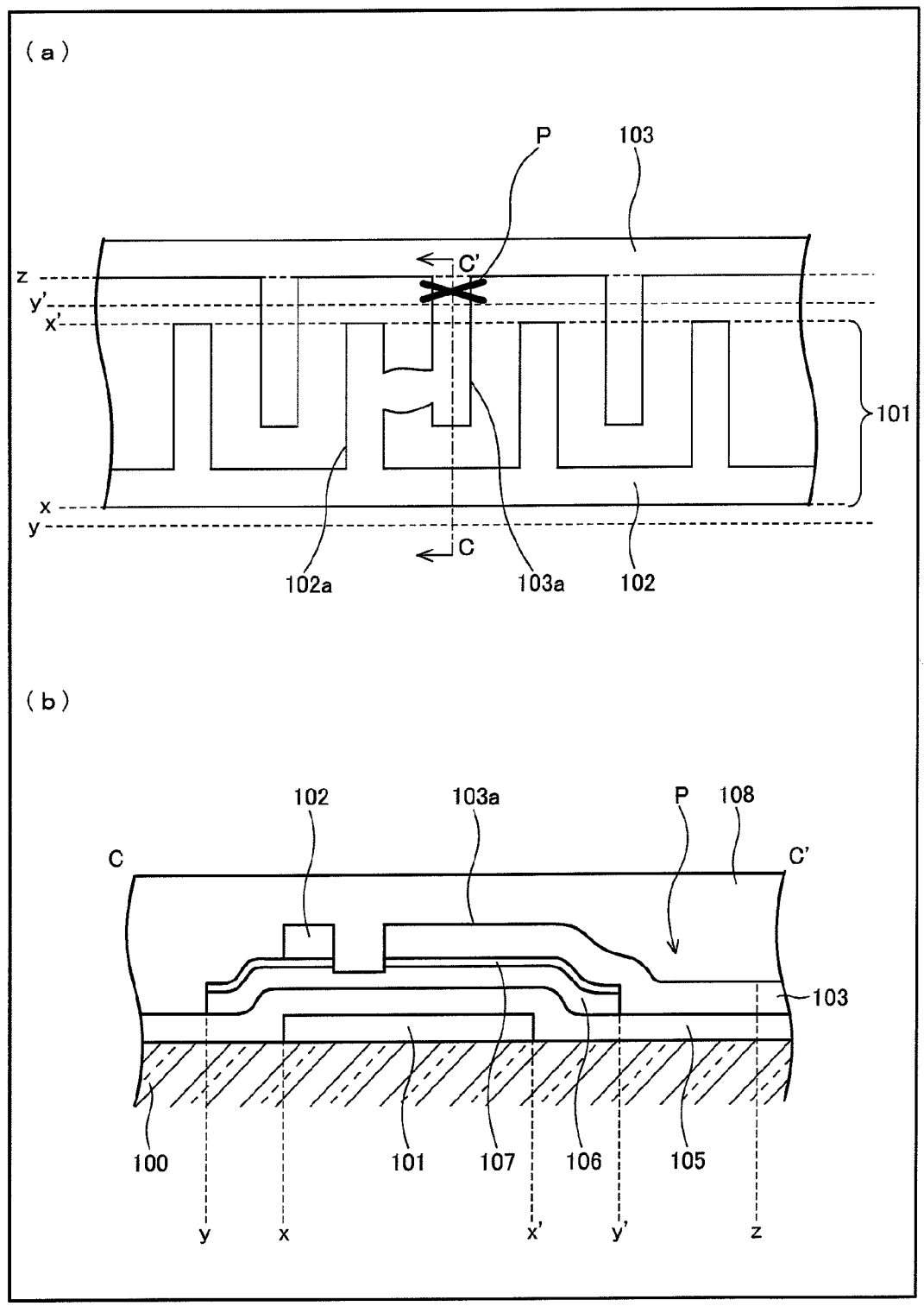
FIG. 10 illustrates problems of the conventional TFT: (a) is a plane view of the conventional TFT; and (b) is a cross-sectional view of the conventional TFT taken along the line C-C' in (a).

FIG. 6 illustrates the configuration of a liquid crystal display device 11 which is a display device according to the present embodiment.

The liquid crystal display device 11 includes a display panel 12, a flexible printed board 13, and a control board 14.

The display panel 12 is an active-matrix display panel in which, with use of amorphous silicon, a display region 12a, a plurality of gate lines (scanning signal lines) GL, a plurality of source lines (data signal lines) SL, and a gate driver (scanning signal line drive circuit) 15 are integrated onto a glass substrate. In the display region 12a, a plurality of picture elements PIX are arranged in a matrix manner. Each of the picture elements PIX includes: a TFT 21 that serve as a selection element of the picture element; a liquid crystal capacitor CL; and an auxiliary capacitor Cs. A gate of the TFT 21 is connected to the gate line GL, and a source of the TFT 21 is connected to the source line SL. The liquid crystal capacitor CL and the auxiliary capacitor Cs are connected to a drain of the TFT 21.

The plurality of gate lines GS including gate lines GL1, GL2, GL3, . . . , and GLn are respectively connected to outputs of the gate driver (scanning signal line drive circuit) 15. The plurality of source lines SL including source lines SL1, SL2, SL3, . . . , and SLm are respectively connected to outputs of the source driver 16 to be described later. Although not illustrated, there are also formed auxiliary capacitor lines to apply auxiliary capacitor voltage to the auxiliary capacitors Cs of the picture elements PIX.

The gate driver 15 is provided in one of two regions adjoining the display region 12a of the display panel 12 in a direction in which the gate lines GL extend, and sequentially supplies gate pulses (scan pulses) to the gate lines GL. The gate driver 15 is formed from amorphous silicon or polycrystalline silicon and integrated into the display panel 12 so as to be monolithically fabricated with the display region 12a. Examples of the gate driver 15 may include all the gate drivers referred to with the terms such as "monolithic gate driver", "gate driver-free", "built-in gate driver in panel", and "gate in panel".

The flexible printed board 13 includes the source driver 16. The source driver 16 supplies data signals to the source lines SL, respectively. To the flexible printed board 13 is connected the control board 14 that supplies the gate driver 15 and the source driver 16 with necessary signals and power. The signals and power to be supplied to the gate driver 15 from the control board 14 pass through the flexible printed board 13 and are then supplied to the gate driver 15 being carried in the surface of the display panel 12.

FIG. 7 illustrates an exemplary structure of the gate driver 15.

As illustrated in FIG. 7, the gate driver 15 includes a shift register 15a. The shift register 15a is provided in one region adjoining the display region 12a along a direction in which the gate lines performing gate outputs G1, G2, . . . extend. The display region 12a serves as an active area of the display panel.

The shift register 15a includes a plurality of cascaded shift register stages sr (sr1, sr2, . . . ). Each of the shift register stages sr includes a set input terminal Qn−1, an output terminal GOUT, a reset input terminal Qn+1, clock input terminals CKA and CKB, and a Low power source input terminal VSS.

An output from the output terminal GOUT of the i-th (i=1, 2, . . . ) shift register stage sri is a gate output Gi to be outputted to the i-th gate line.

To the set input terminal Qn−1 of the first shift register stage sr1, a gate start pulse GSP1 is supplied. To respective set input terminals Qn−1 of second and succeeding shift register stages sri, gate outputs Gi−1 of their preceding shift register stages sri−1 are supplied. Further, to respective reset input terminals Qn+1 of the shift register stages sri, gate outputs Gi+1 of their subsequent shift register stages sri+1 are supplied.

To one of the clock input terminals CKA and CKB, the clock signal CK1 is supplied, and to the other clock input terminal, the clock signal CK2 is supplied. In this manner, destination terminals of the clock signals CK1 and CK2 are reversed between the adjacent shift register stages sr. Here, for the odd-numbered shift register stages sri (i=1, 3, 5, . . . ), clock signals CK1 and CK2 are supplied to the clock input terminals CKA and CKB, respectively. For the even-numbered shift register stages sri (i=2, 4, 6, . . . ), clock signals CK2 and CK1 are supplied to the clock input terminals CKA and CKB, respectively. The clock signals CK1 and CK2 have such phases that their clock pulses do not overlap each other, for example.

Figure 3:
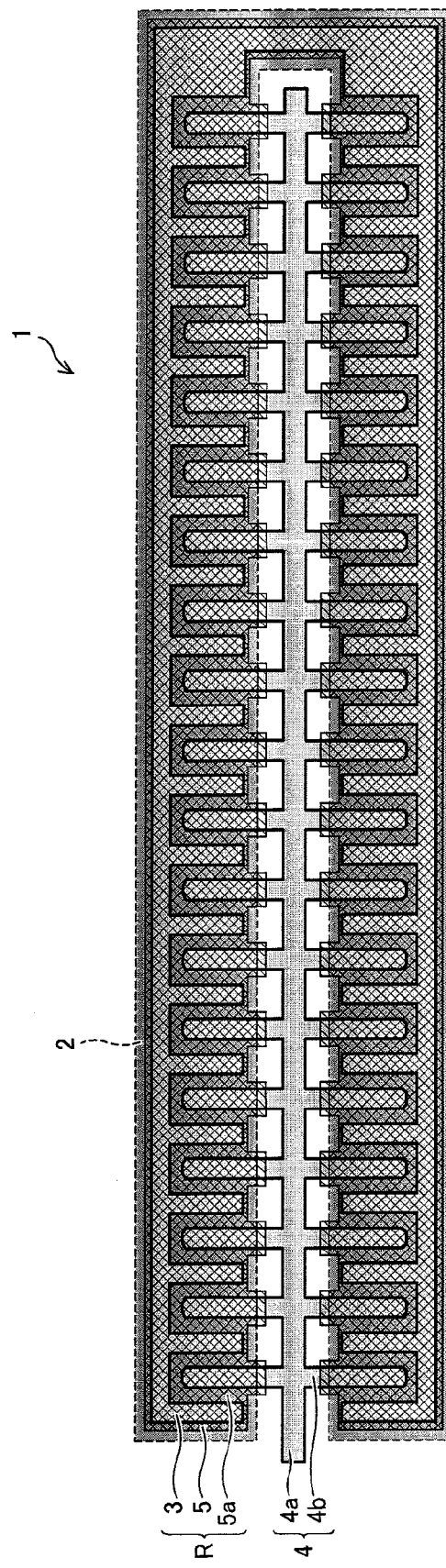
FIG. 3 is a plane view illustrating an overall structure of the TFT in FIG. 1.

FIG. 3 illustrates a structure of the TFT 1 formed in the shift register 15a. The TFT 1 can be used not only as an output transistor of each shift register stage sr shown in FIG. 7, but also as other transistor in the shift register stage sr and as any transistor on the panel.

The TFT 1 includes a gate electrode 2, a first source/drain electrode 3, and a second source/drain electrode 4. When one of the first source/drain electrode 3 and the second source/drain electrode 4 is used as a source electrode, the other is used as a drain electrode.

The gate electrode 2 is a region having a lateral U-shape and is formed on a glass substrate in a lower layer than the first source/drain electrode 3 and the second source/drain electrode 4.

Above the gate electrode 2 in the layer-thickness direction thereof, a stack of an i layer (semiconductor layer) and an $n^+$ layer (which will be described later) is disposed with a gate dielectric layer under the stack. When it is assumed that the region where the i layer is provided is a first region R as represented by hatched lines, the region of the stack is in the first region R, and the first source/drain electrode 3 is provided on the $n^+$ layer in the first region R. In the first region R, a region 5 where the first source/drain electrode 3 is not provided is a region of the i layer where the $n^+$ layer is not provided thereon. The first source/drain electrode 3 has approximately such a shape that a region in which the alignment of the second source/drain electrode 4 is disposed with a separation from the alignment of the first source/drain electrode 3 is removed from the lateral U-shaped region of the gate electrode 2.

The second source/drain electrode 4 includes one electrode line 4a and a plurality of branch electrodes 4b. The electrode line 4a is a linear electrode provided in a gap region in the center of the lateral U-shaped region of the gate electrode 2. The branch electrodes 4b are a group of electrodes that branch off from the electrode line 4a and extend toward both of the first source/drain electrode 3 in the opposite directions. The branch electrodes 4b extend onto the $n^+$ layer in the first region R. The first source/drain electrode 3 is disposed to surround the branch electrodes 4b at a predetermined distance.

As a consequence, the first source/drain electrode 3 and the branch electrodes 4b in the first region R sandwich, in a panel in-plane direction, a pattern of the i layer in the region 5 which i layer is equivalent to the i layer on which the $n^+$ layer does not exist in the stack. This pattern of the i layer serves as a channel forming region 5a of the TFT 1. The TFT 1 thus has a comb-shaped source/drain structure in which the first source/drain electrode 3 and the second source/drain electrode 4 are arranged in such a manner that a plurality of teeth-like electrodes are engaged with each other and thus form the entire channel width.

To the gate electrode 2, the first source/drain electrode 3, and the electrode line 4a of the second source/drain electrode 4, voltages are applied from the outside of the TFT 1.

Figure 1:
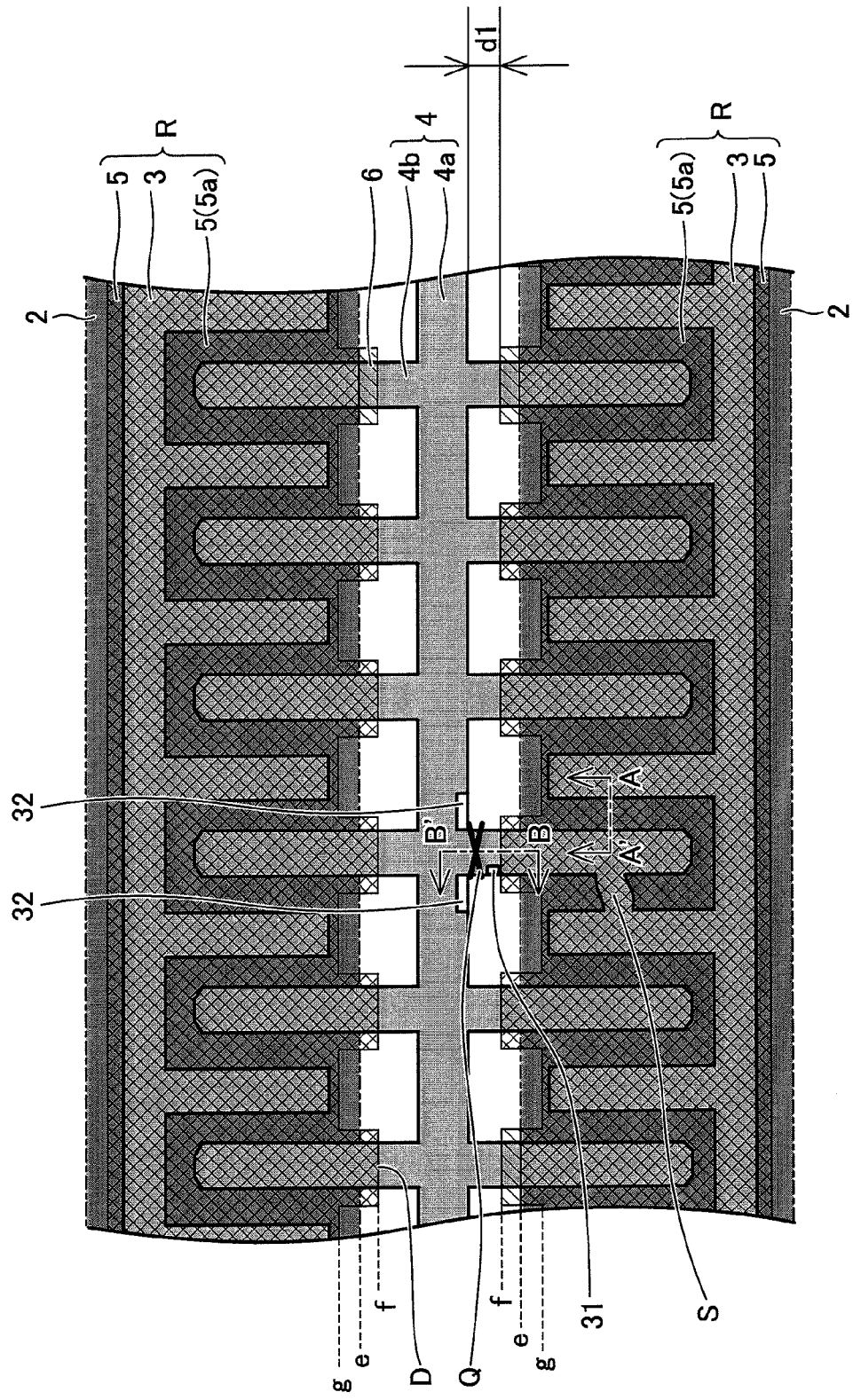
FIG. 1 is a plane view illustrating a detailed structure of a TFT according to an embodiment of the present invention.

FIG. 1 illustrates the structure of the TFT 1 in more detail.

At places D (first places), the branch electrodes 4b extending of the second source/drain electrode 4 start to overlap with the first region R represented by hatched lines in FIG. 1. Here, an edge of the first region R is positioned on a line f which is nearer to the electrode line 4a than a borderline e on an inner side of the lateral U-shape of the gate electrode 2, and regions 6 where the stack of the i layer (semiconductor layer) and the $n^+$ layer protrude beyond the borderline e to the line f are provided. That is, when the gate electrode 2 is seen in the layer-thickness direction, the edge (line f) of the first region R at the places D is nearer to the electrode line 4a than the edge (borderline e) of the gate electrode 2 at places (second places) where the branch electrodes 4b extending start to overlap with the gate electrode 2. Between the neighboring regions 6, the edge of the first region R is set back on a line g that is more away from the electrode line 4a than the borderline e.

A distance d1 (first distance) from the places D to the electrode line 4a is set to be 5 μm or more. In a case where a leakage occurs between the first source/drain electrode 3 and the branch electrode 4b extending of the second source/drain electrode 4, e.g. in a case where the first source/drain electrode 3 and the branch electrode 4b of the second source/drain electrode 4 are shorted to each other at a place S, the distance d1 of 5 μm or more makes it possible to easily project a laser spot onto a point Q on the branch electrode 4b so as to be away from the place D and also from the electrode line 4a. Because the distance d1 is long, the magnification of the optical system for directing the laser spot at a target object is not necessarily very high. As such, the laser spot can be roughly aligned on the branch electrode 4b. This enables, even when the branch electrode 4b is laser-fused, to avoid a direct projection of the laser onto the stack of the i layer and the $n^+$ layer. Therefore, the other adjoining partial TFT regions are in no danger of being damaged by the heat transmission. The same applies to a case where the edge of the first region R at the places D is in the same position as the edge of the gate line 2 at the second places.

The distance d1 is preferably set to be 5 μm or more and 10 μm or less. Setting the distance d1 within this range allows the size of the TFT to be small as a whole. As such, the TFT can easily be manufactured to be smaller than a normal size of a TFT formed in a multi-purpose display device.

Figure 2:
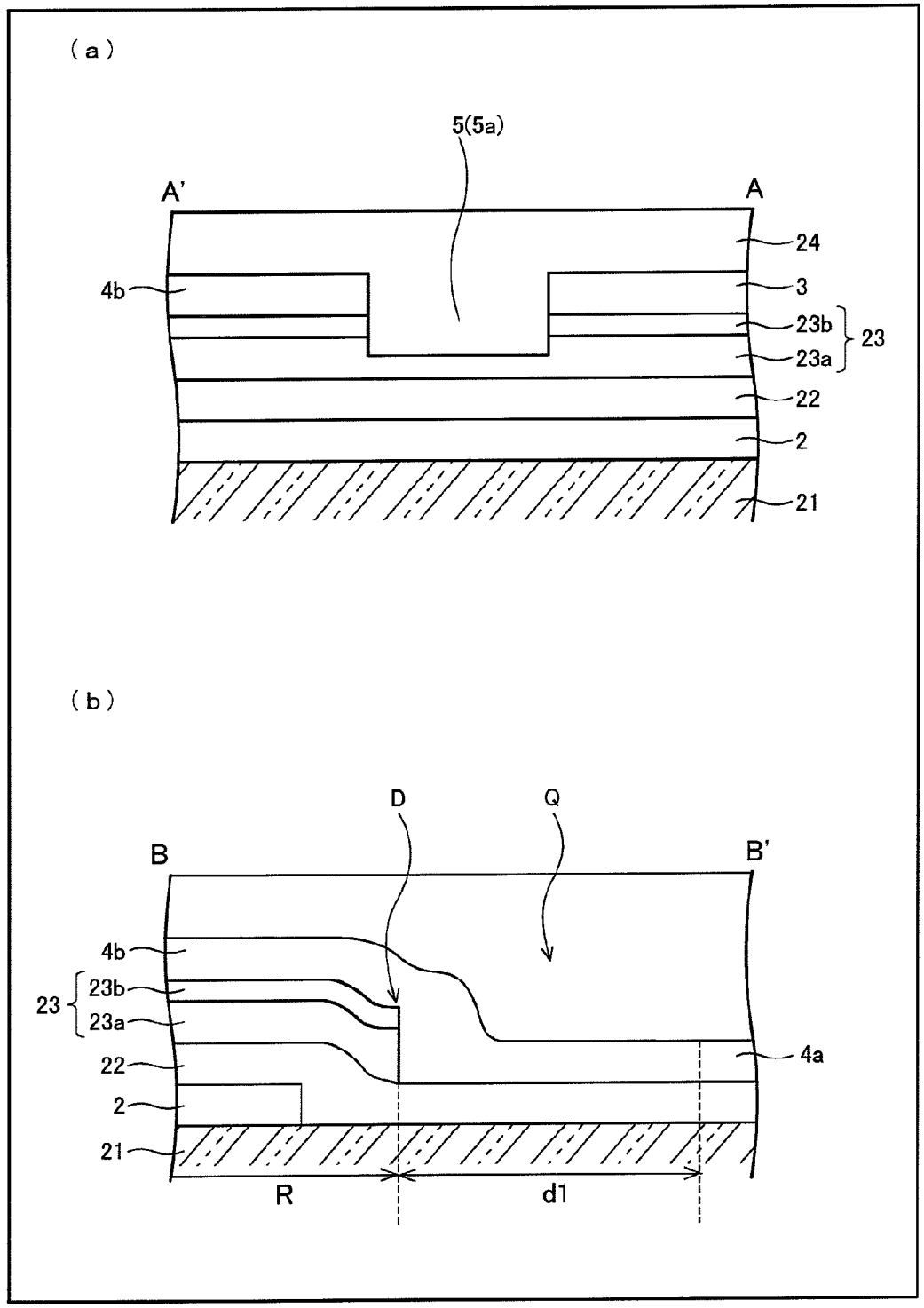
FIG. 2 shows cross-sectional views of FIG. 1: (a) is a cross-sectional view taken along the line A-A' in FIG. 1; and (b) is a cross-sectional view taken along the line B-B' in FIG. 1.

(a) of FIG. 2 is a cross-sectional view taken along the line A-A' in FIG. 1, and (b) of FIG. 2 is a cross-sectional view taken along the line B-B' in FIG. 1.

In the cross-sectional view taken along the line A-A', a cross section is illustrated in which a channel forming region 5a exists between the first source/drain electrode 3 and the branch electrode 4b of the second source/drain electrode 4.

On the glass substrate 21 which is an insulating substrate or a transparent substrate, the gate electrode 2, the gate dielectric layer 22 (dielectric layer), the i layer 23a, the $n^+$ layer 23b, the first source/drain electrode 3 and the second source/drain electrode 4, and a passivation layer 24 are stacked in this order. For example, the gate dielectric layer 22 is formed from SiN, the i layer 23a and the $n^+$ layer 23b are formed from amorphous silicon, and the passivation layer 24 is formed from SiN. The i layer 23a and the $n^+$ layer 23b make up the stack 23. The channel forming region 5a is composed of a pattern of the i layer 23a where the $n^+$ layer 23b of the stack 23 does not exist. The i layer 23a in the channel forming region 5a may be etched so as to be smaller in layer thickness than the other parts of the i layer 23a.

The cross-sectional view taken along the line B-B' illustrates a cross section of the branch electrode 4b extending to the electrode line 4a so as to include the place D.

The first region R exists on the gate electrode 2 side with respect to the place D. Although there is a big step at the place D, the long distance d1 allows the point Q between a region above the gate electrode 2 and the electrode line 4b to be directed at as a target by only rough alignment of the laser spot on the point Q. This eliminates the need for a high-accuracy operation of focusing the optical system on the edge of the first region R at the place D in order to prevent the laser spot from being projected onto the place D.

For further ease of alignment of the laser spot on the point Q, the branch electrode 4b may be provided with a narrowed part. That is, as illustrated in FIG. 1, the branch electrode 4b may be provided with cutout(s) 31 narrowing the line width of the branch electrode 4b on one side or both sides in a width direction thereof at a part immediately in front of the overlap with the first region R. By observing the pattern of the cutout(s) 31, the position of the place D can easily be recognized. Additionally or alternatively, the electrode line 4a may be provided with a narrowed part in the branching point of the branch electrode 4b from the electrode line 4a. That is, the electrode line 4a may be provided with cutout(s) 32 narrowing the line width thereof on one side or both sides of the branching point in the electrode line 4a. By observing the pattern of the cutout(s) 32, the position of the branching point can easily be recognized.

Next, the following will describe a modification example of the TFT 1.

Figure 4:
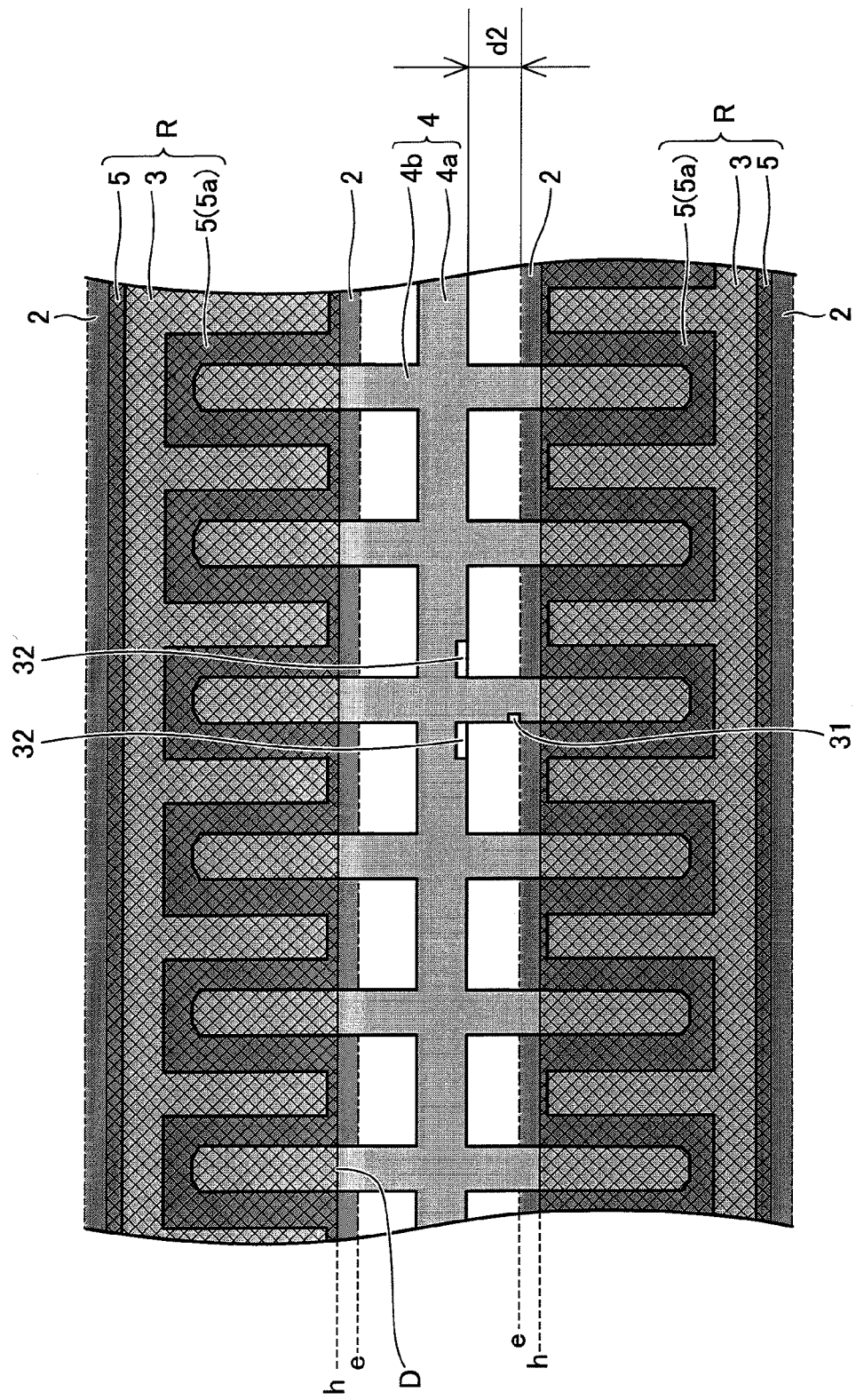
FIG. 4 is a plane view illustrating a detailed structure of a first modification example of a TFT according to an embodiment of the present invention.

FIG. 4 illustrates a configuration of a first modification example of the TFT 1.

In the structure shown in FIG. 4, when the panel is seen in the layer-thickness direction, the first region R is included in the region of the gate electrode 2. The edge of the first region R at the places D where the branch electrodes 4b extending of the second source/drain electrode 4 start to overlap with the first region R is set back on a line h which is more away from the electrode line 4a than the borderline e on the inner side of the lateral U-shape of the gate electrode 2.

Here, when the gate electrode 2 is seen in the layer-thickness direction, the edge (line h) of the first region R at the places D is more away from the electrode line 4a than the edge (borderline e) of the gate electrode 2 at the places (second places) where the branch electrodes 4b extending start to overlap with the region of the gate electrode 2.

In this case, a distance d2 (second distance) from the second places to the electrode line 4a is set to be 5 μm or more, preferably 5 μm or more and 10 μm or less. In comparison with the case shown in FIG. 1, this structure is even more advantageous and effective in that the adjoining partial TFT regions can be prevented from being damaged by the irradiation of the laser spot onto the gate electrode 2. For the same reason as in the FIG. 1, the branch electrode 4b may be provided with the cutout(s) 31 immediately in front of the second place, and/or the electrode line 4a may be provided with the cutout(s) 32.

Figure 5:
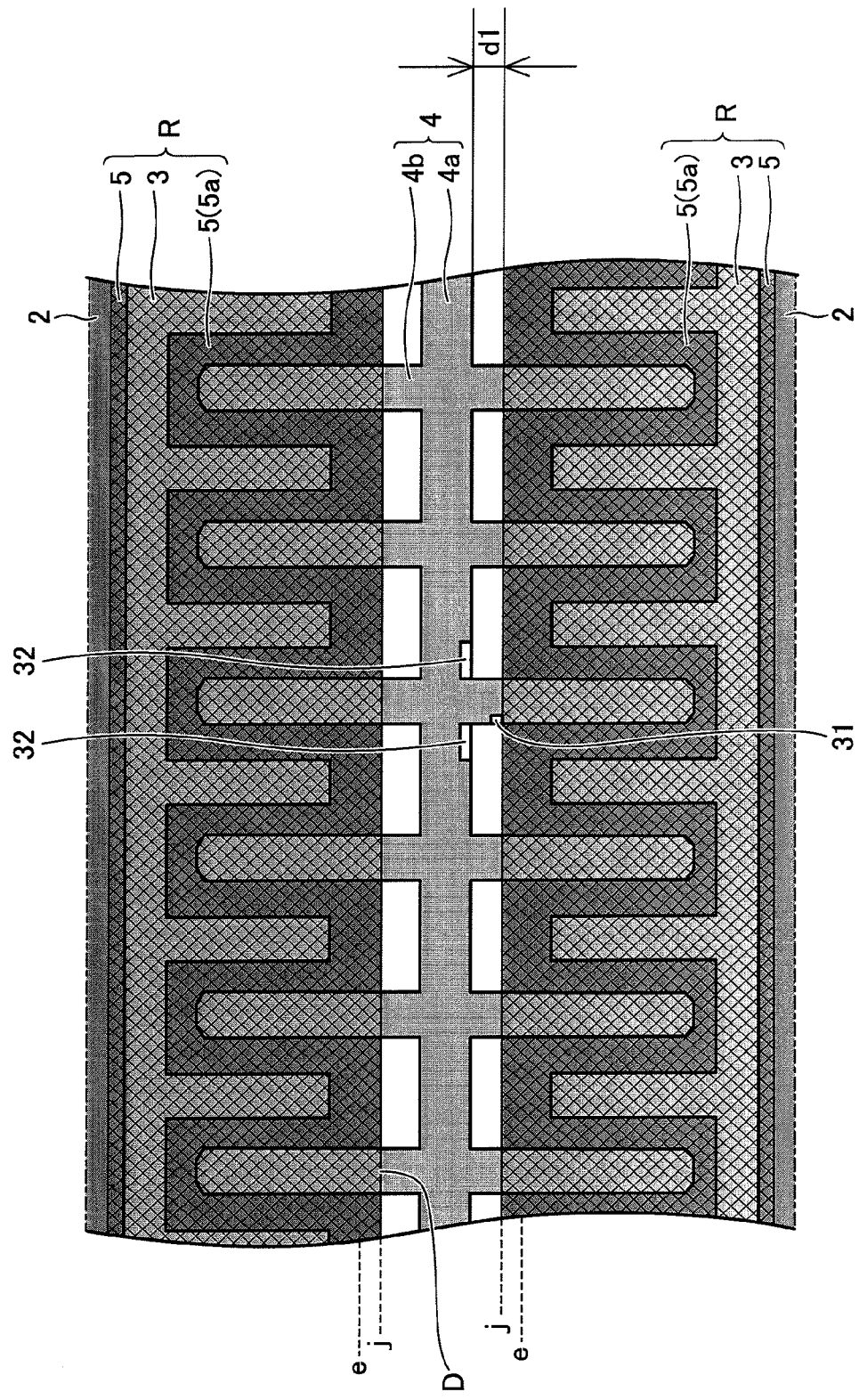
FIG. 5 is a plane view illustrating a detailed structure of a second modification example of a TFT according to an embodiment of the present invention.

FIG. 5 illustrates a second modification example of the TFT 1.

In the structure in FIG. 5, when the panel is seen in the layer-thickness direction, the first region R is shifted overall so as to be nearer to the electrode line 4a than the region of the gate electrode 2. The edge of the first region R at the places D where the branch electrodes 4b extending of the second source/drain electrode 4 start to overlap with the first region R sticks out to a line j which is nearer to the electrode line 4a than the borderline e on the inner side of the lateral U-shape of the gate electrode 2.

In this case, similarly to the structure in FIG. 1, when the gate electrode 2 is seen in the layer-thickness direction, the edge (line j) of the first region R at the places D is nearer to the electrode line 4a than the edge (borderline e) of the gate electrode 2 at the places (second places) where the branch electrodes 4b extending start to overlap with the region of the gate electrode 2. Therefore, the distance d1 (first distance) from the places D to the electrode line 4a is set to be 5 μm or more, preferably 5 μm or more and 10 μm or less. As in FIG. 1, cutout(s) 31 and/or cutout(s) 32 may be provided.

When the branch electrode 4b was laser-fused in each of the above-described TFTs 1, it caused no unnecessary damage, and the TFTs 1 all operated properly. Whether or not the TFT 1 is operating properly can be determined by examining, for example, a relation between a drain current and a gate voltage or a relation between a drain-source voltage and a drain current the parameter of which is a gate voltage.

Above were described cases where a display device is a liquid crystal display device. However, the present invention is not limited thereto and can generally be applied to display devices in which the TFT is formed, i.e., EL display device, plasma display, and the like.

The TFT does not necessarily have a lateral U-shape. As long as the first source/drain electrode and the plurality of the branch electrodes of the second source/drain electrode are disposed so as to sandwich the separation region in the panel in-plane direction in the first region, the TFT may have an arbitrary shape in its entirety.

The branch electrodes of the second source/drain electrode do not necessarily branch off in a perpendicular direction to the electrode line. That is, the branch electrodes may be arbitrarily directed. Furthermore, the direction along which the branch electrodes overlap with the first region is not necessarily perpendicular to the edge of the first region. In other words, the branch electrodes may overlap with the first region along an arbitrary direction. In a case where the extending direction of the electrode line and the tangent line of the edge of the first region are not in parallel, the distance between any point on the edge of the first region and the electrode line is assumed to be the length of a perpendicular to the tangent line in the panel plain from the point to an intersection with the electrode line.

Semiconductor materials to be used are not limited to amorphous silicon: polycrystalline silicon, CG silicon, microcrystalline silicon (μc-Si), and the like can also be used. In particular, it is advantageous for an amorphous silicon TFT to adopt a comb-shaped source/drain structure having a large channel width so as to enhance the driving ability thereof. As such, use of amorphous silicon in manufacturing a TFT according to the present embodiment makes it possible to improve manufacturing yield of the TFT, thereby significantly reducing costs. In the meantime, a microcrystalline silicon TFT has higher mobility than an amorphous silicon TFT, which allows the transistor size to be small in comparison with the amorphous silicon TFT. Moreover, use of microcrystalline silicon in manufacturing a TFT realizes a small-footprint TFT, which is favorable for forming a slim picture frame. It is also possible to curb variations of threshold voltage caused by application of DC biases.

[Embodiment 2]

The following describes another embodiment of the present invention with reference to FIGS. 11 to 14. Unless otherwise noted, the members indicated by the same reference numerals as those described in the foregoing Embodiment 1 have the same functions.

A high-definition liquid crystal display device includes a number of source lines SL. Hence, as shown in a liquid crystal display device 41 in FIG. 14, a source driver is often composed of a plurality of chips such as source drivers 16a, 16b, and 16c. However, this results in increasing the number of source drivers and the mounting area thereof. In view of this problem, liquid crystal display devices driven by a SSD (Source Shared Driving) method are provided in which the source driver has a smaller number of outputs and the source lines SL of R, G, and B are driven in a time-sharing manner.

Figure 11:
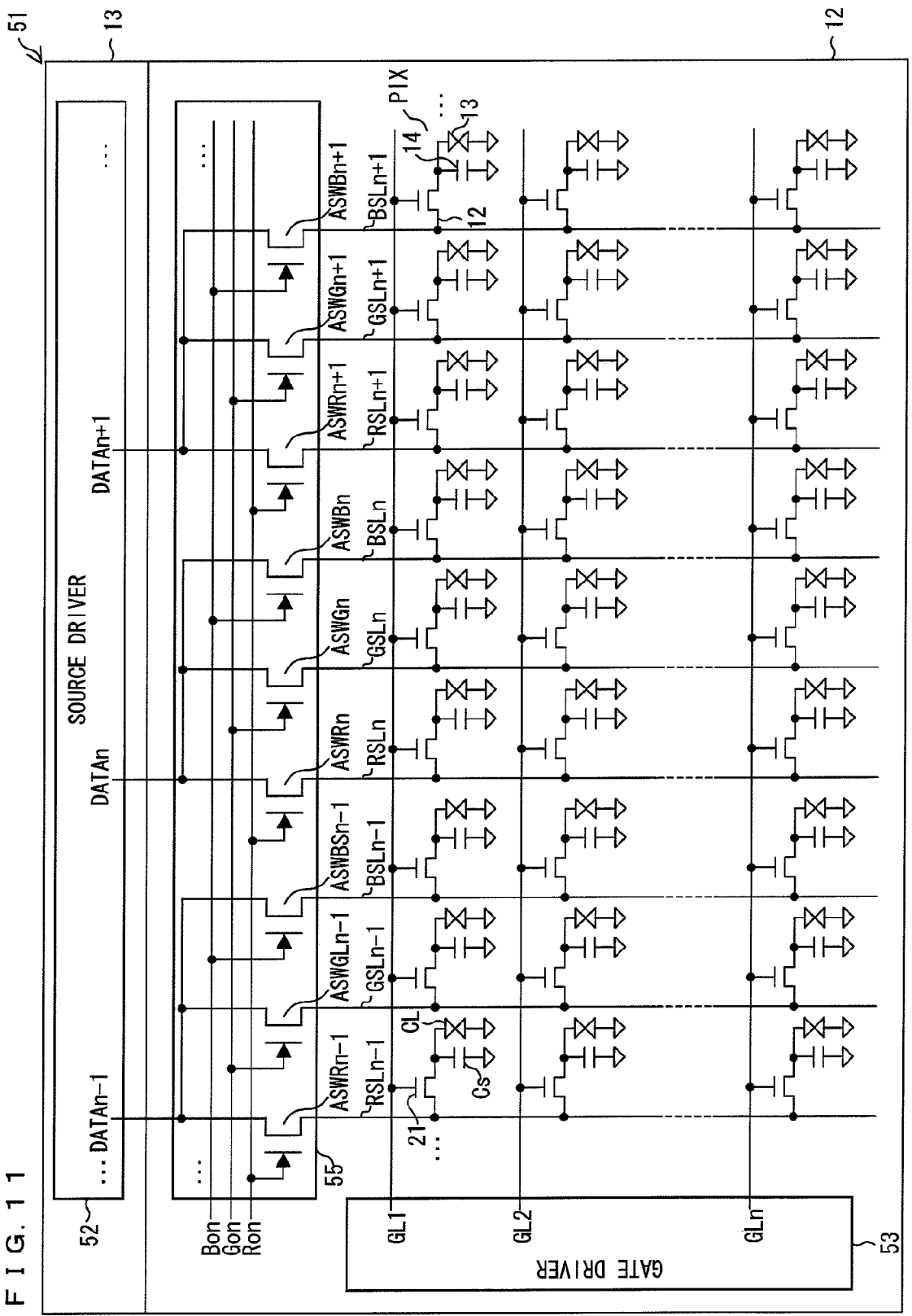
FIG. 11 is a block diagram illustrating a structure of a display device according to an embodiment of the present invention.

FIG. 11 illustrates a structure of a display device according to the present embodiment, i.e., a liquid crystal display device 51 driven by the SSD method.

The liquid crystal display device 51 includes a display panel 12 and a flexible printed board 13. The liquid crystal display device 51 may further include a control board 14.

The display panel 12 includes picture elements PIX, a gate driver (scanning signal line drive circuit) 53, and a SSD circuit (switch circuit) 55. On the flexible printed board 13, a source driver (data signal line drive circuit) 52 is mounted in the form of a chip.

Similarly to the gate driver 15, the gate driver 53 is monolithically integrated onto the display panel 12 so as to include the TFTs 1. A source line (data signal line) RSL to which picture elements PIX of R are connected, a source line (data signal line) BSL to which picture elements PIX of G are connected, and a source line (data signal line) BSL to which picture elements PIX of B are connected make up a group, and a plurality of the groups are adjacently arranged. FIG. 11 illustrates source lines RSL (RSLn−1, GSLn−1, and BSLn−1) of an n−1th group, source lines RSL (RSLn, GSLn, and BSLn) of an n-th group, and source lines RSL (RSLn+1, GSLn+1, and BSLn+1) of an n+1th group.

The SSD circuit 55 includes: switches ASWR (in the drawing, ASWRn−1, ASWRn, and ASWRn+1) each connected to one end of each source line RSL on the data signal supply side; switches ASWG (in the drawing, ASWGn−1, ASWGn, and ASWGn+1) each connected to one end of each source line GSL on the data signal supply side; and switches ASWB (in the drawing, ASWBn−1, ASWBn, and ASWBn+1) each connected to one end of each source line BSL on the data signal supply side. While one ends of the switches ASWR, ASWG, and ASWB are respectively connected to the source lines RSL, GSL, and BSL of the same group, the other ends thereof are connected with each other and to the output DATA (in the drawing, DATAn−1, DATAn, or DATAn+1) of the source driver 52.

As described above, the number of outputs DATA of the source driver 52 is as small as one third of the total number of the outputs of the source drivers 16a, 16b, and 16c of the liquid crystal display device 41. This causes the number of the source drivers to decrease to one third, thereby reducing the mounting area as well.

The switches ASWR, ASWG, and ASWB are respectively composed of the foregoing TFTs 1. Into the gates thereof are respectively inputted ON signals Ron, Gon, and Bon to turn on the switches ASWR, ASWG, and ASWB in turn for approximately one third of a horizontal period in a time-sharing manner. When the ON signal Ron is high, the switches ASWR are turned on, during which the outputs DATA of R are outputted from the source driver 52 so as to be supplied to the source lines RSL. When the ON signal Gon is high, the switches ASWG are turned on, during which the outputs DATA of G are outputted from the source driver 52 so as to be supplied to the source lines GSL. When the ON signal Bon is high, the switches ASWB are turned on, during which the outputs DATA of B are outputted from the source driver 52 so as to be supplied to the source lines BSL.

In each of the switches ASWR, ASWG, and ASWB, one of the first source/drain electrode 3 and the second source/drain electrode 4 is connected to the corresponding source line, while the other is connected to the output DATA of the source driver 52.

In the liquid crystal display device 51, the SSD circuit 55 includes the TFTs 1 provided correspondingly for a plurality of paths, i.e., source lines RSL, GSL, and BSL. The TFTs 1 serve as switches ASWR, ASWG, and ASWB via which each of the outputs of the source driver 52 is connected to the plurality of paths in a branched manner. Because the outputs of the source driver 52 are thus branched and connected to a plurality of paths via the switches composed of TFTs 1, it is possible to manufacture a switch circuit composed of TFTs having large channel widths with high yield. The TFTs with large channel widths are advantageously used to connect the outputs of the source driver 52 to low-impedance loads such as the source lines. Consequently, the liquid crystal display device 51 can be manufactured with high yield.

Further, the liquid crystal display device 51 is driven such that, with respect to each output of the source driver 52, the switches ASWR, ASWG, and ASWB are conducted in a time-sharing manner during a horizontal period. Therefore, the display device driven by the SSD method can be manufactured with high yield.

Moreover, in the liquid crystal display device 51, the SSD circuit 55 is formed on the display panel 12 so as to be monolithically integrated with the display region. When forming the switch circuit on the display panel so as to be monolithically integrated with the display region, the TFT cannot help but having a large channel width in order to enhance the driving ability. This results in a disadvantage in the production process that difficulty arises in manufacturing the display device with high yield. However, including the TFTs 1 as switches in the SSD circuit 55 makes up for such disadvantages in the production process and enables to manufacture the display device with high yield. In the liquid crystal display device 51, the gate driver 53 is also formed on the display panel 12 so as to be monolithically integrated with the display region. Here, including the TFTs 1 in the gate driver 53 makes up for the above-mentioned disadvantages in the production process and enables to manufacture the display device with high yield.

Figure 12:
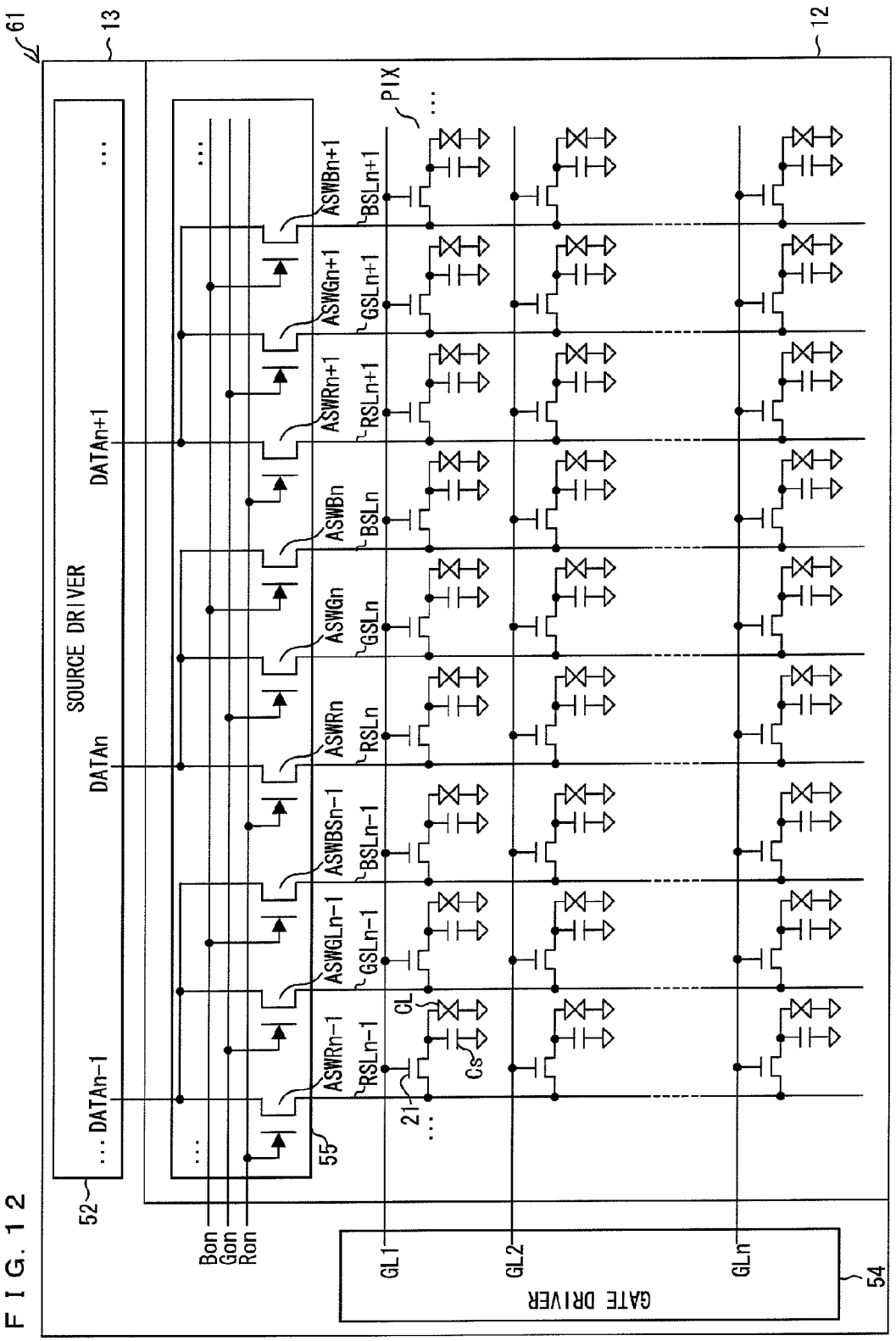
FIG. 12 is a block diagram illustrating a structure of a display device according to an embodiment of the present invention.

FIG. 12 shows a structure of another display device according the present embodiment, i.e., a liquid crystal display device 61 driven by the SSD method.

The liquid crystal display device 61 includes, instead of the gate driver 53 in the liquid crystal display device 51, a gate driver 54 mounted on the flexible printed board 13 in the form of a chip. As for the rest, the liquid crystal display device 61 is configured similarly to the liquid crystal display device 51. As in this case, it is possible to configure the display device by using TFTs 1 as the switches ASWR, ASWG, and ASWB in the SSD circuit 55 and adopting a common CMOS circuit as the gate driver 54, for example.

The liquid crystal display devices 51 and 61 are configured to be driven in a time-sharing manner with a division number of three, i.e., R, G, and B. However, the liquid crystal display device driven by the SSD method may be configured to be driven in a time-sharing manner with an arbitrary division number such as two, four, and more. With an increase in the division number, the number of the outputs of the source drivers and the number of the source drivers can be decreased accordingly.

Figure 13:
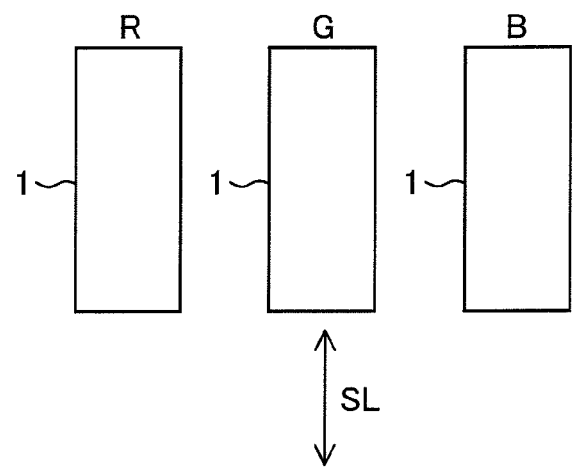
FIG. 13 shows plane views illustrating arrangements of TFTs in the display devices in FIGS. 11 and 12, where (a) and (b) depict different arrangements, respectively.
Figure 13:
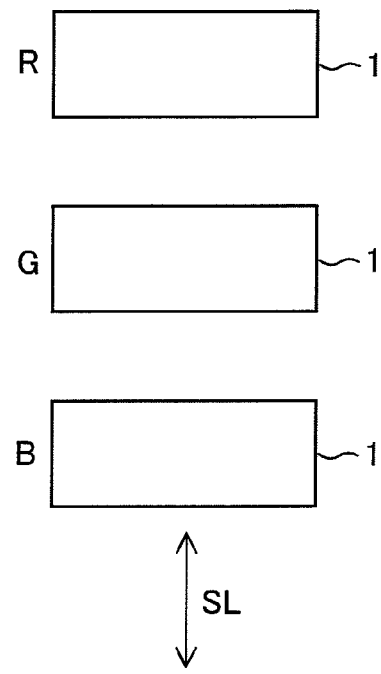

(a) and (b) of FIG. 13 show examples of how the TFTs 1 are arranged in a liquid crystal display device driven by the SSD method, such as the liquid crystal display devices 51 and 61. (a) of FIG. 13 illustrates arranging the TFTs 1 shown in FIG. 3 serving respectively as the switches ASWR, ASWG, and ASWB. Each of the TFTs 1 has a rectangular shape in its entirety such that a longer side thereof is in parallel with the extending direction of the source lines SL. (b) of FIG. 13 illustrates arranging, as the switches ASWR, ASWG, and ASWB, the TFTs 1 shown in FIG. 3 each having a rectangular shape such that a longer side thereof is orthogonal to the extending direction of the source lines SL. In (b) of FIG. 13, TFT can have a rectangular shape whose longer sides and shorter sides are oppositely positioned to the TFT 1 shown in FIG. 3. This is accomplished by, for example: (i) while keeping the same lateral U-shape as the TFT 1 shown in FIG. 3, decreasing the length of the electrode line 4a; (ii) decreasing the number of the branch electrodes 4b accordingly; and (iii) increasing the lengths of the branch electrodes 4b.

The present invention is not limited to the description of the embodiments above, but may be altered by a skilled person within the scope of the claims. An embodiment based on a proper combination of technical means disclosed in different embodiments is encompassed in the technical scope of the present invention.

As described above, a TFT according to the present invention includes a gate electrode, a first source/drain electrode, and a second source/drain electrode, one of the first source/drain electrode and the second source/drain electrode being a source electrode and the other being a drain electrode, the TFT including an i layer and a stack in which an $n^+$ layer is stacked on the i layer, the i layer and the stack being formed from a semiconductor material and disposed above the gate electrode but with a dielectric layer under the i layer and the stack in a layer-thickness direction, the first source/drain electrode being disposed on the $n^+$ layer in a first region, the first region being a panel in-plane region where the i layer is provided, the second source/drain electrode including an electrode line provided outside the first region and a plurality of branch electrodes branching off and extending from the electrode line, the branch electrodes extending from the electrode line onto the $n^+$ layer in the first region, the i layer having a pattern provided between the first source/drain electrode and the branch electrodes in the first region in a panel in-plane direction, the pattern including no $n^+$ layer in the first region, and in the TFT according to the present invention, when the gate electrode is seen in the layer-thickness direction, an edge of the first region at first places where the branch electrodes extending start to overlap with the first region is (i) nearer to the electrode line than an edge of the gate electrode at second places where the branch electrodes extending start to overlap with a region of the gate electrode; or (ii) in a same position as the edge of the gate electrode at the second places; and a first distance from the edge of the first region at the first places to the electrode line is 5 μm or more.

As a consequence, an effect is produced that a TFT is realized including a comb-shaped source/drain structure that enables easy repair of a source-drain leakage.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

INDUSTRIAL APPLICABILITY

The present invention can be particularly preferably used for display devices such as liquid crystal display devices and EL display devices.

The invention claimed is:

1. A TFT comprising a gate electrode, a first source/drain electrode, and a second source/drain electrode, one of the first source/drain electrode and the second source/drain electrode being a source electrode and the other being a drain electrode,
the TFT including an i layer and a stack in which an $n^+$ layer is stacked on the i layer, the i layer and the stack being formed from a semiconductor material and disposed above the gate electrode but with a dielectric layer under the i layer and the stack in a layer-thickness direction,
the first source/drain electrode being disposed on the $n^+$ layer in a first region, the first region being a panel in-plane region where the i layer is provided,
the second source/drain electrode including an electrode line provided outside the first region and a plurality of branch electrodes branching off and extending from the electrode line,
the branch electrodes extending from the electrode line onto the $n^+$ layer in the first region,
the i layer having a pattern provided between the first source/drain electrode and the branch electrodes in the first region in a panel in-plane direction, the pattern including no $n^+$ layer in the first region,
wherein:
when the gate electrode is seen in the layer-thickness direction, an edge of the first region at first places where the branch electrodes extending start to overlap with the first region is more away from the electrode line than an edge of the gate electrode at second places where the branch electrodes extending start to overlap with a region of the gate electrode; and
a second distance from the edge of the gate electrode at the second places to the electrode line is 5 μm or more wherein:
the branch electrode is provided with a cutout narrowing a line width thereof,
the cutout being provided on one side or both sides of the branch electrode in a width direction thereof at a part immediately in front of the second place.

2. The TFT according to claim 1, wherein:
the second distance is 10 μm or less.

3. The TFT according to claim 1, wherein:
the semiconductor material is amorphous silicon.

4. The TFT according to claim 1, wherein:
the semiconductor material is microcrystal silicon.

5. A shift register including a plurality of stages composed of transistors, wherein:
at least one of the transistors is a TFT according to claim 1.

6. A scanning signal line drive circuit including a shift register according to claim 5, wherein:
the shift register is used to generate a scanning signal for a display device.

7. The scanning signal line drive circuit according to claim 6, wherein:
the TFT is an output transistor outputting the scanning signal.

8. A display device including a scanning signal line drive circuit according to claim 6.

9. The display device according to claim 8, wherein:
the scanning signal line drive circuit is formed on a display panel so as to be monolithically integrated with a display region.

10. A switch circuit including a plurality of TFTs according to claim 1, wherein:
the TFTs are provided correspondingly for a plurality of paths, respectively, and
the TFTs serving as switches via which each of outputs of a data signal line drive circuit is connected to the respective paths in a branched manner.

11. The switch circuit according to claim 10, wherein:
when seen in a layer-thickness direction, each of the TFTs serving as the switches has a rectangular region whose longer side is in parallel with an extending direction of data signal lines serving as the paths.

12. The switch circuit according to claim 10, wherein:
when seen in a layer-thickness direction, each of the TFTs serving as the switches has a rectangular region whose longer side is orthogonal to an extending direction of data signal lines serving as the paths.

13. A display device including a switch circuit and a data signal line drive circuit according to claim 10, wherein:
a plurality of paths are data signal lines.

14. The display device according to claim 13, wherein:
the display device is driven such that, with respect to each of the outputs, the switches are conducted in a time-sharing manner during a horizontal period.

15. The display device according to claim 13, wherein:
the switch circuit is formed on a display panel so as to be monolithically integrated with a display region.

16. A display device including:
a scanning signal line drive circuit including a shift register used to generate a scanning signal for the display device, the shift register having a plurality of stages composed of transistors, wherein at least one of the transistors is a TFT comprising a gate electrode, a first source/drain electrode, and a second source/drain electrode, one of the first source/drain electrode and the second source/drain electrode being a source electrode and the other being a drain electrode,
the TFT including an i layer and a stack in which an $n^+$ layer is stacked on the i layer, the i layer and the stack being formed from a semiconductor material and disposed above the gate electrode but with a dielectric layer under the i layer and the stack in a layer-thickness direction,
the first source/drain electrode being disposed on the $n^+$ layer in a first region, the first region being a panel in-plane region where the i layer is provided,
the second source/drain electrode including an electrode line provided outside the first region and a plurality of branch electrodes branching off and extending from the electrode line,
the branch electrodes extending from the electrode line onto the $n^+$ layer in the first region,
the i layer having a pattern provided between the first source/drain electrode and the branch electrodes in the first region in a panel in-plane direction, the pattern including no $n^+$ layer in the first region,
wherein:
when the gate electrode is seen in the layer-thickness direction, an edge of the first region at first places where the branch electrodes extending start to overlap with the first region is (i) nearer to the electrode line than an edge of the gate electrode at second places where the branch electrodes extending start to overlap with a region of the gate electrode; or (ii) in a same position as the edge of the gate electrode at the second places; and a first distance from the edge of the first region at the first places to the electrode line is 5 µm or more; and a switch circuit and a data signal line drive circuit according to claim 10, a plurality of paths being data signal lines.

17. The display device according to claim 16, wherein:

at least one of the scanning signal line drive circuit and the switch circuit is formed on a display panel so as to be monolithically integrated with a display region.

18. A display device, wherein:

a TFT according to claim 1 is formed on a display panel so as to be monolithically integrated with a display region.

19. A TFT comprising a gate electrode, a first source/drain electrode, and a second source/drain electrode, one of the first source/drain electrode and the second source/drain electrode being a source electrode and the other being a drain electrode, the TFT including an i layer and a stack in which an n$^+$ layer is stacked on the i layer, the i layer and the stack being formed from a semiconductor material and disposed above the gate electrode but with a dielectric layer under the i layer and the stack in a layer-thickness direction, the first source/drain electrode being disposed on the n$^+$ layer in a first region, the first region being a panel in-plane region where the i layer is provided, the second source/drain electrode including an electrode line provided outside the first region and a plurality of branch electrodes branching off and extending from the electrode line, the branch electrodes extending from the electrode line onto the n$^+$ layer in the first region, the i layer having a pattern provided between the first source/drain electrode and the branch electrodes in the first region in a panel in-plane direction, the pattern including no n$^+$ layer in the first region, wherein:

when the gate electrode is seen in the layer-thickness direction, an edge of the first region at first places where the branch electrodes extending start to overlap with the first region is more away from the electrode line than an edge of the gate electrode at second places where the branch electrodes extending start to overlap with a region of the gate electrode; and a second distance from the edge of the gate electrode at the second places to the electrode line is 5 µm or more wherein:

the branch electrode is provided with a cutout narrowing a line width thereof, the cutout being provided on one side or both sides of the branch electrode in a width direction thereof at a part immediately in front of the second place, the electrode line is provided with a cutout narrowing a line width thereof, the cutout being provided on one side or both sides of branching points where the branch electrodes branch off from the electrode line.

20. The TFT according to claim 19, wherein:
the second distance is 10 µm or less.

21. The TFT according to claim 19, wherein:
the semiconductor material is amorphous silicon.

22. The TFT according to claim 19, wherein:
the semiconductor material is microcrystal silicon.

23. A display device, wherein:

a TFT according to claim 19 is formed on a display panel so as to be monolithically integrated with a display region.

* * * * *